US006697443B1

United States Patent
Kim et al.

(10) Patent No.: US 6,697,443 B1
(45) Date of Patent: Feb. 24, 2004

(54) COMPONENT DECODER AND METHOD THEREOF IN MOBILE COMMUNICATION SYSTEM

(75) Inventors: Min-Goo Kim, Suwon-shi (KR); Beong-Jo Kim, Songnam-shi (KR); Young-Hwan Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 606 days.

(21) Appl. No.: 09/679,925

(22) Filed: Oct. 5, 2000

(30) Foreign Application Priority Data

Oct. 5, 1999  (KR) ......................................... 1999-42924
Oct. 6, 1999  (KR) ......................................... 1999-43118

(51) Int. Cl.[7] .............................. H03D 1/00; H04L 27/06
(52) U.S. Cl. ........................ 375/341; 375/262; 714/795; 714/796; 714/794
(58) Field of Search ................................. 375/341, 262, 375/265; 714/794, 795, 796

(56) References Cited

U.S. PATENT DOCUMENTS

| 4,583,078 | A | * | 4/1986 | Shenoy et al. ................. 341/51 |
| 5,295,142 | A | * | 3/1994 | Hatakeyama ................. 714/794 |
| 5,509,021 | A | * | 4/1996 | Todoroki ..................... 714/795 |
| 5,995,562 | A | * | 11/1999 | Koizumi ...................... 375/341 |
| 6,212,664 | B1 | * | 4/2001 | Feygin et al. ................. 714/796 |
| 6,236,692 | B1 | * | 5/2001 | Keirn .......................... 375/341 |
| 6,301,684 | B1 | * | 10/2001 | Watanabe et al. ............ 714/796 |
| 6,385,753 | B1 | * | 5/2002 | Hatakeyama ................ 714/796 |
| 6,405,342 | B1 | * | 6/2002 | Lee ............................. 714/792 |
| 6,408,420 | B1 | * | 6/2002 | Todoroki ..................... 714/795 |

FOREIGN PATENT DOCUMENTS

| JP | 09-200060 | 7/1997 |
| JP | 09-232972 | 9/1997 |
| JP | 09-232973 | 9/1997 |

* cited by examiner

*Primary Examiner*—Phoung Phu
(74) *Attorney, Agent, or Firm*—Dilworth & Barrese LLP

(57) ABSTRACT

There is provided a decoder and a decoding method for decoding data modulated with a recursive systematic convolutional code (RSC) in a mobile communication system. In the decoder, a branch metric calculating circuit (BMC) calculates branch metrics (BMs) associated with a plurality of input symbols. An add-compare-select circuit (ACS) receives the BMs and previous path metrics (PMs) and generates an plurality of path selectors and LLR (Log Likelihood Ratio) data including the plurality of path selectors and reliability information at a first time instant. A maximum likelihood (ML) state searcher has a plurality of cells in an array with rows and columns, connected to one another according to an encoder trellis, cells in each row having a process time, Ds, for outputting the same value of the cells in the last column as an ML state value representing an ML path in response to the path selectors. A delay delays the LLR data received from the ACS by the time Ds. An LLR update circuit has a plurality of processing elements (PEs) in an array with rows and columns, connected according to the encoder trellis, PEs in each row having a process time, $D_L$, for generating updated LLR values from the PEs at a time instant (first time instant–approximately $DS+D_L$) in response to the delayed LLR data received from the delay. A selector selects one of the updated LLR values based on the ML state value.

11 Claims, 17 Drawing Sheets

| PMM0 | D7 | D6 | D5 | D4 | D3 | D2 | D1 | D0 |
|---|---|---|---|---|---|---|---|---|
| PMM1 | D7 | D6 | D5 | D4 | D3 | D2 | D1 | D0 |
| PMM2 | D7 | D6 | D5 | D4 | D3 | D2 | D1 | D0 |
| PMM3 | D7 | D6 | D5 | D4 | D3 | D2 | D1 | D0 |
| PMM4 | D7 | D6 | D5 | D4 | D3 | D2 | D1 | D0 |
| PMM5 | D7 | D6 | D5 | D4 | D3 | D2 | D1 | D0 |
| PMM6 | D7 | D6 | D5 | D4 | D3 | D2 | D1 | D0 |
| PMM7 | D7 | D6 | D5 | D4 | D3 | D2 | D1 | D0 |

FIG. 9

COMPONENT DECODER AND METHOD THEREOF IN MOBILE COMMUNICATION SYSTEM

PRIORITY

This application claims priority to an application entitled "Component Decoder and Method Thereof in Mobile Communication System" filed in the Korean Industrial Property Office on Oct. 5, 1999 and assigned Serial No. 99-42924, and an application entitled "Data Decoding apparatus and Method Thereof in Communication System" filed in the Korean Industrial Property Office on Oct. 6, 1999 and assigned Serial No. 99-43118, the contents of each are herein incorporated by reference.

BACKGROUND OF THE INVENTION

1. Field of the Invention

The present invention relates generally to a decoder and a decoding method in a mobile communication system, and in particular, to a component decoder and a method thereof for decoding data modulated with a turbo code that uses recursive systematic convolutional codes (RSCs).

2. Description of the Related Art

Channel codes are widely used for reliable data communication in mobile communication systems such as satellite systems, W-CDMA (Wideband-CDMA), and CDMA 2000. The channel codes include convolutional codes and turbo codes.

In general a convolutional coded signal is decoded using a Viterbi algorithm based on maximum-likelihood (ML) decoding. The Viterbi algorithm accepts a soft value at its input and produces a hard decision value. In many cases, however, soft-output decoders are required in order to improve performance through concatenated decoding. In this context, many schemes have been suggested to achieve soft output or the reliability of decoded symbols. There are two well-known soft-input/soft-output (SISO) decoding methods, namely, a MAP (Maximum A-posteriori Probability) decoding algorithm, and a SOVA (Sof-Output Viterbi Algorithm). The MAP algorithm is considered the best in terms of bit error rate (BER) since it produces a hard decision value in conjunction with an a-posteriori probability, but at the cost of implementation complexity. J. Hagenauer suggested in 1989 the SOVA scheme to which the Viterbi algorithm is generalized. The SOVA outputs a hard decision value and reliability information that is soft output associated with the hard decision value, as well. Hagenauer, however, did not provide the real configuration and operation of the SOVA scheme.

As compared to conventional Viterbi algorithms, SOVA generates a hard decision value and reliability information about the hard decision. That is, the soft output provides the reliability of a decoded symbol as well as the polarity of the decoded symbol, −1 or +1, for subsequent decoding. To achieve such reliability information, SOVA calculates path metrics (PMs) for a survivor path (SP) and a competition path (CP) and produces the absolute value of the difference between the PM of the SP and the PM of the CP as the reliability information. The reliability information δ is given by $$\delta = a^* |PM_s - PM_c|, \quad a>0 \tag{1}$$

PMs are calculated in the same manner as in a general Viterbi algorithm.

To describe SOVA in detail, a trellis is assumed in which there are $S=2^{k-1}$ (k is a constraint length) states and two branches enter each state.

Given a sufficient delay W, all survivor paths merge into one path in the general Viterbi algorithm. W is also used as the size of a state cell window. In other words, with the state cell window size W set to be sufficient, all survivor paths merge into one path. This is called a maximum likelihood (ML) path. The Viterbi algorithm selects the minimum of m PMs calculated by Eq. (2) to choose a state $S_K$ on the path at a given time k.

$$Pm = \text{MIN}\left\{ \frac{E_S}{N_O} \sum_{j=k-W}^{i} \sum_{n=1}^{N} (Y_{jn}^{(m)} - x_{jn}^{(m)})^2 \right\} \text{ for } m=1,2 \tag{2}$$

where $x_{jn}^{(m)}$ is an $n^{th}$ bit of an N-bit code symbol at a branch on an $m^{th}$ path at time j, $y_{jn}^{(m)}$ is a received code symbol at the position of the code symbol $x_{jn}^{(m)}$, and $E_S/N_O$ is a signal-to-noise ratio. The probability of selecting the $m^{th}$ path using $P_m$, that is, the probability of selecting path 1 or path 2 in Eq. (2) is given by $$Pr=\{\text{path}=m\} \approx e^{-Pm} \text{ for } m=1,2 \tag{3}$$

If a path with a smaller PM is 1 in Eq. (3), the Viterbi algorithm selects path 1. Here, the probability of selecting a wrong path is calculated by $$P_{sk} = \frac{e^{-P_1}}{e^{-P_1} + e^{-P_2}} = \frac{1}{1+e^{\Delta}} \tag{4}$$

where $\Delta = P_2 - P_1 > 0$. Let information bits on path 1 and path 2 at time j be $U_j^{(1)}$ and $U_j^{(2)}$, respectively. Then the Viterbi algorithm generates h errors at all the positions ($e_0, e_1, e_2, \ldots, e_{n-1}$) with $U_j^{(1)} \neq U_j^{(2)}$. If the two paths meet after length $\delta_m$ ($\delta_m \leq Wm$), there exist h different information bits and ($\delta_m - h$) identical information bits for the length $\delta_m$. In case a previous wrong decision probability $P_j$ related with path 1 is stored, it can be updated by $$P_j \leftarrow P_j(1-P_{sh}) + (1-P_j)P_{sk} \tag{5}$$

on the assumption that path 1 has been selected.

In Eq. (5), $P_j(1-P_{sk})$ is the probability of selecting a right path and $(1-P_j)P_{sk}$ is the probability of selecting a wrong path. Eq. (5) represents probability update by adding the right path selecting probability to the wrong path selecting probability.

Such an iterative update operation is implemented with a log likelihood ratio (LLR) expressed as $$L_j = \log\left(\frac{1-P_j}{P_j}\right) \tag{6}$$

$$L_j \leftarrow \min(L_j, \Delta/a)$$

where $\Delta$ is $P_2 - P_1$ and $\alpha$ is a constant.

In conclusion, in the case that estimated information bits are different on the survivor path (path 1) and the competition path (path 2), namely, $U_j^{(1)} \neq U_j^{(2)}$, the SOVA update operation applies only when the LLR at time j is less than the previous LLR.

FIG. 1 illustrates example LLR update on a trellis with four states. To be more specific, going from time t1 to time t2, information bits are identical on the survivor path (path 1) and the competition path (path 2). The LLR update does not apply to this state transition. On the other hand, information bits for the two paths are different going from t2 to t3 and from t3 to t4, for which the LLR is updated. For t3 and t4, the LLR is compared with the previous LLR and updated if the LLR is less than the previous LLR.

The above SOVA scheme can be implemented by a trace-back or chain-back SOVA (hereinafter referred to as TBSOVA). An ML path is traced back for the window size W at each decoding in TBSOVA. The resulting decoding delay brings about implementation problems in the case of high speed applications, for example, a mobile terminal.

SUMMARY OF THE INVENTION

It is, therefore, an object of the present invention to provide an apparatus and method for decoding turbo-coded data by RESOVA (Register Exchange SOVA) in a mobile communication system.

It is another object of the present invention to provide a RESOVA decoding apparatus and method for decoding turbo-coded data and convolutional coded data in a mobile communication system.

It is a further object of the present invention to provide a RESOVA decoding apparatus and method which reduce decoding delay and memory size requirements at a receiver for receiving turbo-coded or convolutional coded data in a mobile communication system.

It is still another object of the present invention to provide a RESOVA decoding apparatus and method in a mobile communication system, in which an ML state search window (ML state cell window) outputs an ML state value at time (k–Ds) with respect to an arbitrary time k, and LLR update window outputs an LLR selected based on the ML state value at approximately time (k–Ds–$D_L$) at a component decoder.

It is yet another object of the present invention to provide a decoding apparatus and method in a mobile communication system, in which a component decoder having an ML state search window and an LLR update window receives a virtual code to increase the accuracy of the ML state search at the boundary of a frame and further performs the ML state search on the frame boundary by the size of the ML state search window.

The above objects can be achieved by providing a decoder and a decoding method for decoding data received form a transmitter. The data is encoded with an RSC in a mobile communication system. In the decoder, a branch metric calculating circuit (BMC) calculates branch metric values (BMs) associated with a plurality of input symbols. An add-compare-select circuit (ACS) receives the BMs and previous path metric values (PMs) and generates an plurality of path selection bits and LLR (Log Likelihood Ratio) data including the plurality of path selection bits and reliability information at a first time instant. A maximum likelihood (ML) state searcher has a plurality of cells in an array with rows and columns, connected to one another according to an encoder trellis, cells in each row having a process time, Ds, for outputting the same value of the cells in the last column as an ML state value representing an ML path in response to the path selectors. A delay delays the LLR data received from the ACS by the time Ds. An LLR update circuit has a plurality of processing elements (PEs) in an array with rows and columns, connected according to the encoder trellis, PEs in each row having a process time, $D_L$, for generating updated LLR values from the PEs at a time instant (first time instant–approximately Ds+$D_L$) in response to the delayed LLR data received from the delay. A selector selects one of the updated LLR values based on the ML state value.

BRIEF DESCRIPTION OF THE DRAWINGS

The above and other objects, features and advantages of the present invention will become more apparent from the following detailed description when taken in conjunction with the accompanying drawings in which:

FIG. 9 illustrates the structure of a PM memory (PMM) shown in FIG. 2 in the case where there are eight states in the trellis according to the present invention;

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

There will be given a detailed description of the configuration and operation of a decoder based on RESOVA that exhibits the best performance among decoding schemes suggested up to now.

Figure 2:
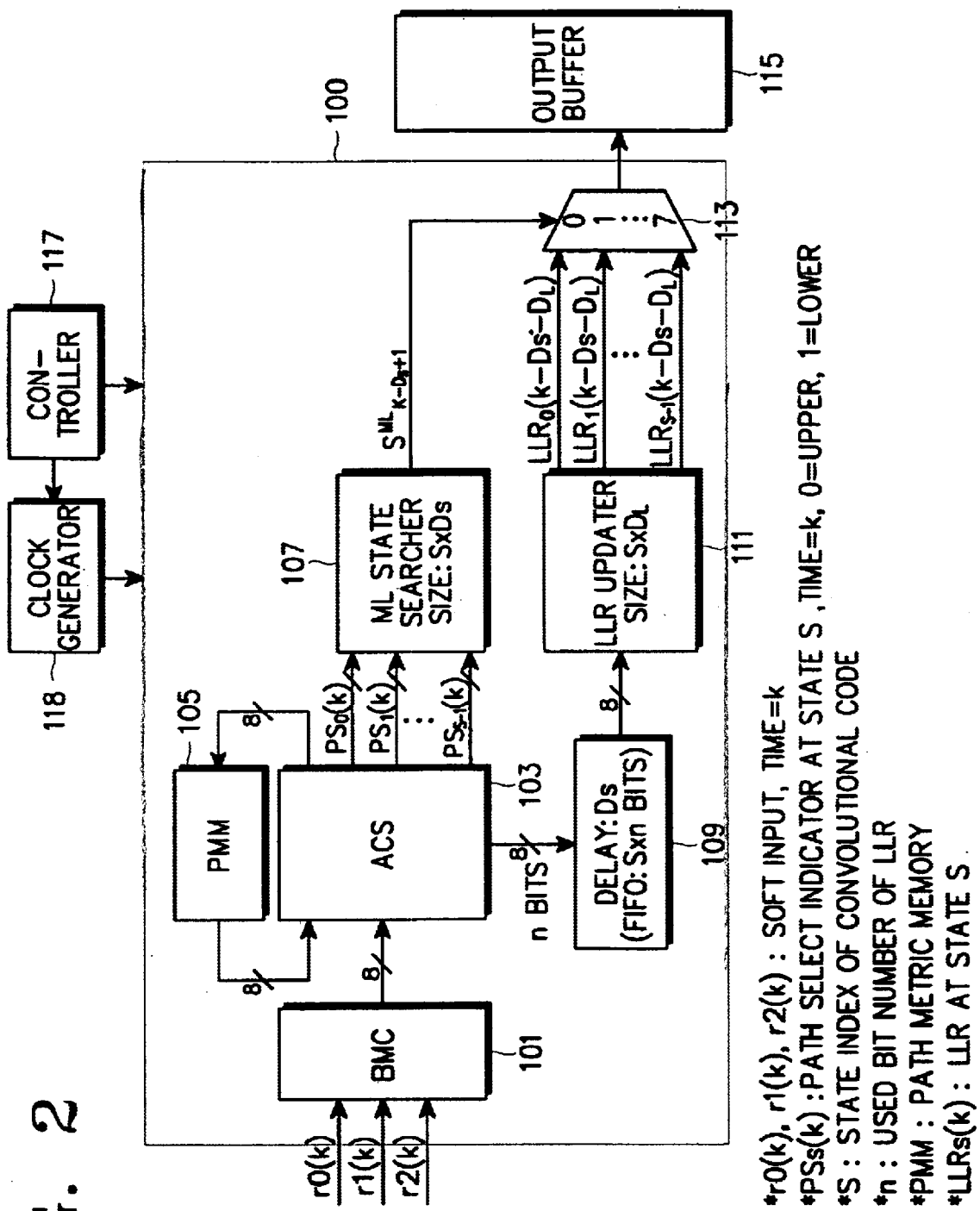
FIG. 2 is a block diagram of a RESOVA decoder according to an embodiment of the present invention.

FIG. 2 is a block diagram of a RESOVA decoder according to an embodiment of the present invention. Referring to FIG. 2, a RESOVA decoder 100 operates under the control of a controller 117 and is activated by a clock signal received from a clock generator 118. The clock generator 118 generates the clock signal under the control of the controller 117 and provides it to the RESOVA decoder 100 according to the present invention. It is to be understood that the RESOVA decoder 100 will not be described in conjunction with the control operation of the controller 117 and the clock signal generated from the clock generator 118.

We assume an ⅓ turbo encoder have 3 memory (ie, k=4) in this invention. Upon receipt of demodulated code symbols r0(k), r1(k), and r2(k), a branch metric calculator BMC 101 calculates branch metrics (BMs) for all possible paths between the states at the current time instant(k) and the states at the previous time instant. In real implementation, once the current state is known, the previous states are easily detected on a trellis. In the case of a convolutional code or a turbo code, two BMs are produced for each state to which previous states are transitioned. With eight states given, two branches enter each state at any time instant and 16 BMs are calculated for all the possible paths. The BMs are a set of correlation measurements, that is, the correlations of all possible codewords s c0, c1, and c2 stored in the BMC to the received code symbols r0, r1, and r2. The codewords that are already been stored in the BMC are all possible codewords generated from an encoder generator polynomial g(x) on the trellis. For example, for code rate R=⅓, one BM for each state can be expressed as Eq. (7) with respect to eight combinations of c0, c1, c2∈{0, 1}. While two BMs can be generated for each state, eight codewords can be generated by combining c0, c1, and c2. Consequently, eight BMCs 101 are virtually required. Eight BMs are provided to an ACS 103 concurrently.

$$BM = (1 - 2 \times c0) \times r0 + (1 - 2 \times c1) \times r1 + (1 - 2 \times c2) \times r2 \quad (7)$$
$$= \sum_{i=0}^{n} \{(1 - 2 \times c_i) \times r_i\} \ n = 0, 1, 2$$

where the upper line represents BM calculation with the use of the code symbols c0, c1, and c2 and the received code symbols r0, r1, and r2, and the lower line represents a generalized equation of the upper equation. The code symbols c0, c1, and c2 are those that the receiver knows and each has 0 or 1 values. The received code symbols r0, r1, and r2 are those that the receiver received from a transmitter. The received code symbols(r0, r1, r2) have a soft value. In the case of a turbo code, r0 is eight bits and each of r1 and r2 is six bits according to the present invention. The r0 is 8 bits because extrinsic information generated during decoding is added to a systematic code symbol. At an initial decoding, the extrinsic information is 0 bit and hence the 6-bit systematic code is received as r0.

Figure 6:
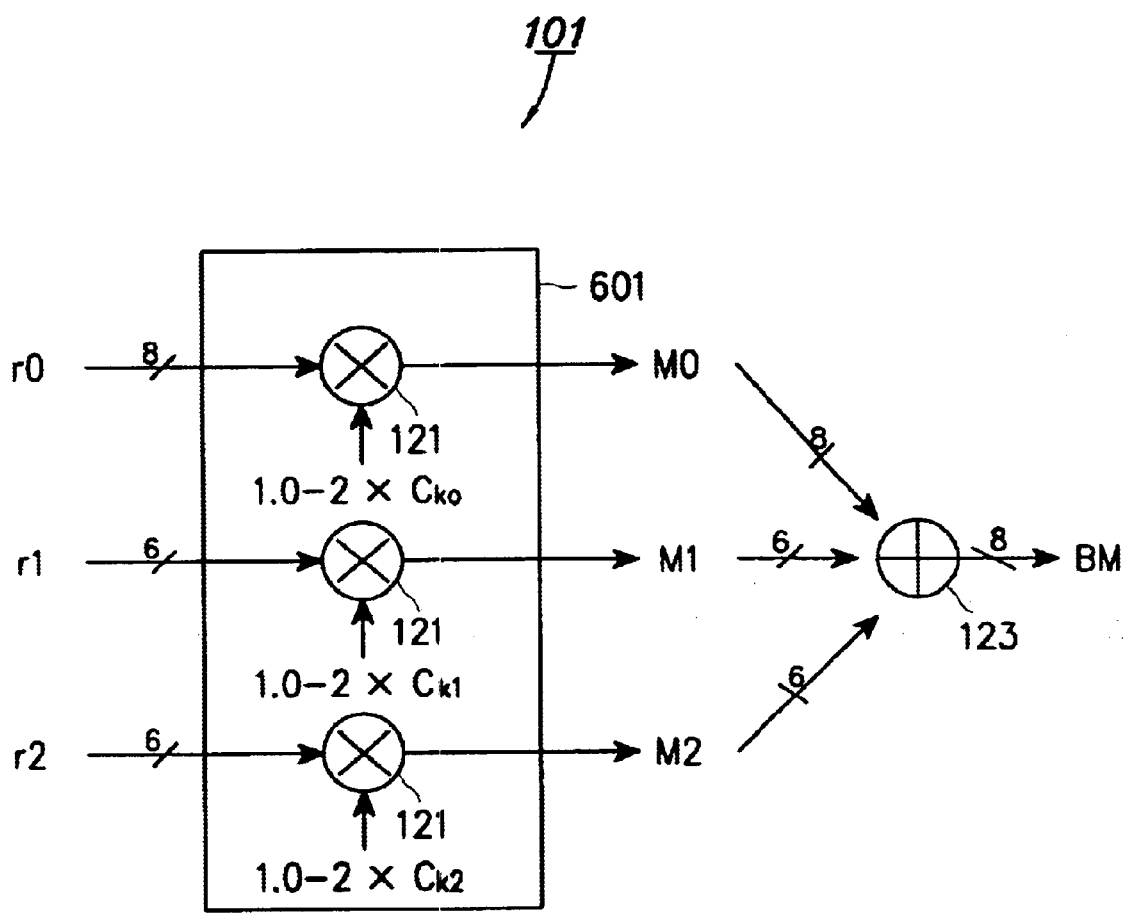
FIG. 6 illustrates the structure of a BMC shown in FIG. 2.

FIG. 6 illustrates the BMC 101 that implements Eq. (7) for one state. Multipliers 121 multiply the received code symbols r0, r1, and r2 by the code symbols c0, c1, and c2 that the BMC stores, and output M0, M1, and M2 to an adder 123. Thus the output of the adder 123 is also eight bits except that r0 is six bits at an initial decoding.

When the structure of the BMC 101 shown FIG. 6 is actually implemented in hardware, multiplications are omitted and M0, M1 and M2 are obtained by inverting input symbol bits depending on the codeword(c0, c1, c2). Table 1 shows a BMC operation in a 6-bit binary system. Referring to Table 1, if the codeword is 0, there is no change in the input symbol bits during the BMC operation. If the codeword is 1, each input symbol bit is inverted and then 000001 is added.

TABLE 1

| assume the received sample is [r0r1r2] | | BMC operation | Example of inner product in 2's compliment |
|---|---|---|---|
| c0c1c2 | (1−2*ci) | | Assume $r_1 = [011111] = (+31)$ |
| (000) | (+++) | +r0+r1+r2 | if $c_i = 0$ $ci*r_i = [011111] = (+31)$ |
| (001) | (++−) | +r0+r1−r2 | if $c_1 = 1$ $ri*r_i = [100000] + [000001] = [100001] = (−31)$ |
| (010) | (+−+) | +r0−r1+r2 | Assume $r_i = [011111] = (−31)$ |
| (011) | (+−−) | +r0−r1−r2 | if $c_1 = 0$ $ci*r_i = [100001] = (−31)$ |
| (100) | (−++) | −r0+r1+r2 | if $c_1 = 1$ $ci*r_i = [011110] + [000001] = [011111] = (+31)$ |
| (101) | (−+−) | −r0+r1−r2 | Assume $r_i = [000000] = (0)$ |
| (110) | (−−+) | −r0−r1+r2 | if $c_1 = 0$ $ci*r_i = [000000] = (0)$ |
| (111) | (−−−) | −r0−r1−r2 | If $c_1 = 0$ $ci*r_i = [111111] + [000001] = [000000] = (0)$ |

The ACS 103 will be described in detail referring to FIGS. 7 and 8.

Figure 7:
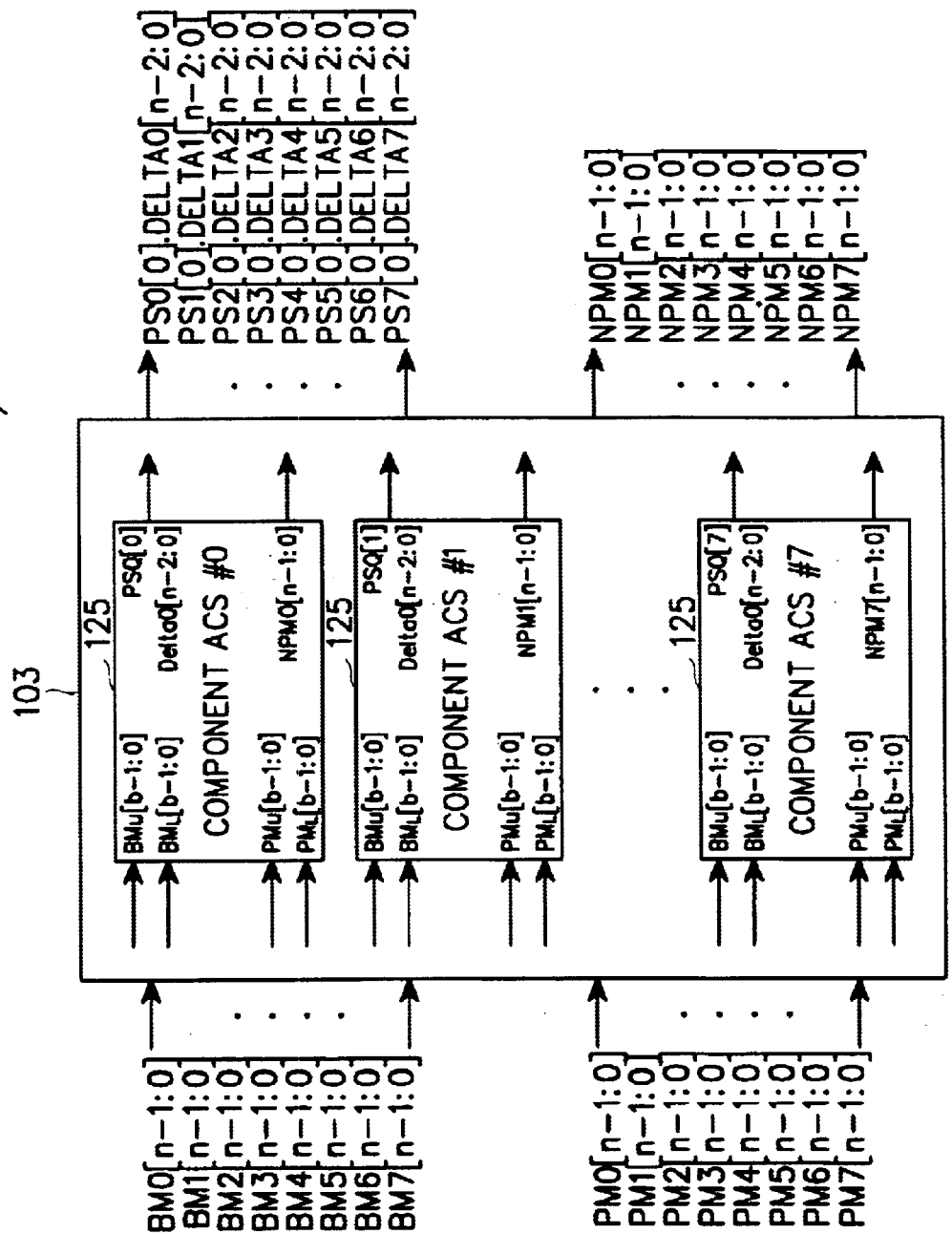
FIG. 7 is a block diagram of an ACS shown in FIG. 2.

FIG. 7 is a block diagram of the ACS 103 in the case of a trellis with eight states according to the embodiment of the present invention. In FIG. 7, the ACS 103 has eight component ACSs 125. This implies that addition, comparison, and selection are occurred simultaneously for the eight states. The ACS 103 receives the eight BMs (BM0 to BM7), each BM being b bits, from the BMC 101 and the previous ACS-operated path metrics (PMs) PM0 to PM7 from a path metric memory(PMM) 105. According to the state relationship on the trellis, the component ACSs(#0 to #7) receive two ones among the BMs (BM0 to BM7) for each state respectively. The metric for the upper branch that comes down to the corresponding state is called $BM_U$ and the metric for the lower branch that comes down to the corresponding state is called $BM_L$. The component ACSs(#0 to #7) also receive $PM_U$ and $PM_L$ corresponding to $BM_U$ and $BM_L$ according to the connection state on the trellis respectively. Connection between each component ACS 125 and $BM_U$ and $BM_L$, $PM_U$ and $PM_L$ is determined by the state relationship on the trellis, as stated above.

To calculate PMs for all the possible states at the current time instant, one of two hypotheses (survivor path and competition path) set for each state is selected. A next path metric (NPM) is computed using the given $BM_U$ and $BM_L$ and $PM_U$ and $PM_L$ of the two states at the previous time instant that may transition to the specific state, by

ADD $$NPM_U := PM_U + BM_U$$
$$NPM_L := PM_L + BM_L$$

COMPARE AND SELECT

IF $(PM_U < PM_L) PM := PM_L$; ELSE $PM: PM_U$ \quad (8)

Figure 8:
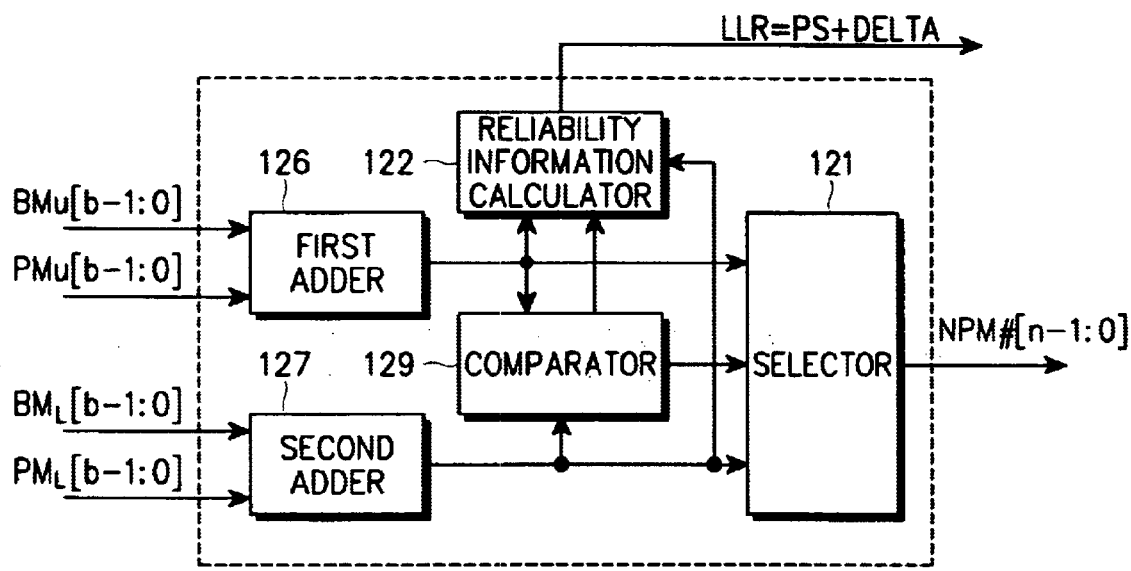
FIG. 8 is a block diagram of a component ACS shown in FIG. 7.

FIG. 8 is a detailed block diagram of the component ACS 125. Referring to FIG. 8, the component ACS 125 has two adders 126 and 127, a comparator 129, a selector 121, and a reliability information calculator 122. The first adder 126 adds $BM_U$ and $PM_U$ and the second adder 127 adds $BM_L$ and $PM_L$. The comparator 129 compares the outputs of the first and second adders 126 and 127 and outputs a path selection bit indicating up or down path to the reliability information calculator 122 and the selector 121. The reliability information calculator 122 calculates reliability information δ from the outputs of the first and second adders 126 and 127. The reliability information calculator 122 outputs an LLR by adding the reliability information δ to the path selection bit received from the comparator 129. The reliability information δ is given by $$\delta = a * |PM_U - PM_L|, a > 0 \quad (9)$$

where a is a constant, ½. According to the present invention, the reliability information δ is calculated not with the survivor path and the competition path but with the upper and lower PMs, $PM_U$ and $PM_L$.

As described above, the reliability information calculator 122 outputs reliability data (LLR) including the path selection bit plus δ. The reliability data (LLR) is comprised of the 1 path selection bit at the MSB (Most Significant Bit) and (n−1)-bit δ starting from the LSB (Least Significant Bit). The path selection bit representing a sign bit at the MSB of the LLR or an estimated information bit can be used only when an encoder uses the RSC. This is because in the case of a typical convolutional code, input information on two paths that reach one state has an equal value. For example, if the input information on one of the paths is 0, the input information on the other path is also 0. In contrast, in the case of the recursive iterative convolutional code, an information bit 0 leads to state transition to a specific state by one of two paths that enter the state and an information bit 1 leads to state transition to the state by the other path. Here, up/down(low) path selection should be defined. For example, the path selection bit 1 or 0 can be defined as upper bifurcation and lower bifurcation, or vice versa. The selector 121 receives the PMs from the first and second adders 126 and 127 and the path selection bit from the comparator 129, and selects one of the PMs as a state value. In conclusion, the ACS 103 outputs eight LLRs and eight state values for the next time instant.

The PMM 105 stores the PM values received from the ACS 103. FIG. 9 illustrates the structure of a PMM with eight states, each state expressed in 8 bits. The PMM 105 stores 8-bit PM values associated with the eight states, which are calculated at the current time instant, and provides the stored PM values as the previous PM values at the next time instant to the ACS 103. More specifically, each of component PMMs PMM0 to PMM7 is an 8-bit register. The component PMM PM0 stores the eight bits of the PM value PM0 received from the ACS 103. In this manner, the component PMMs PM1 to PM7 store the 8-bit PM values PM1 to PM7 received from the ACS 103, respectively.

An ML state searcher 107 has state values labeling the given states, receives series of path selection bits in parallel from the ACS 103, and searches for an ML state value among the state values by a register exchange method.

Figure 10A:
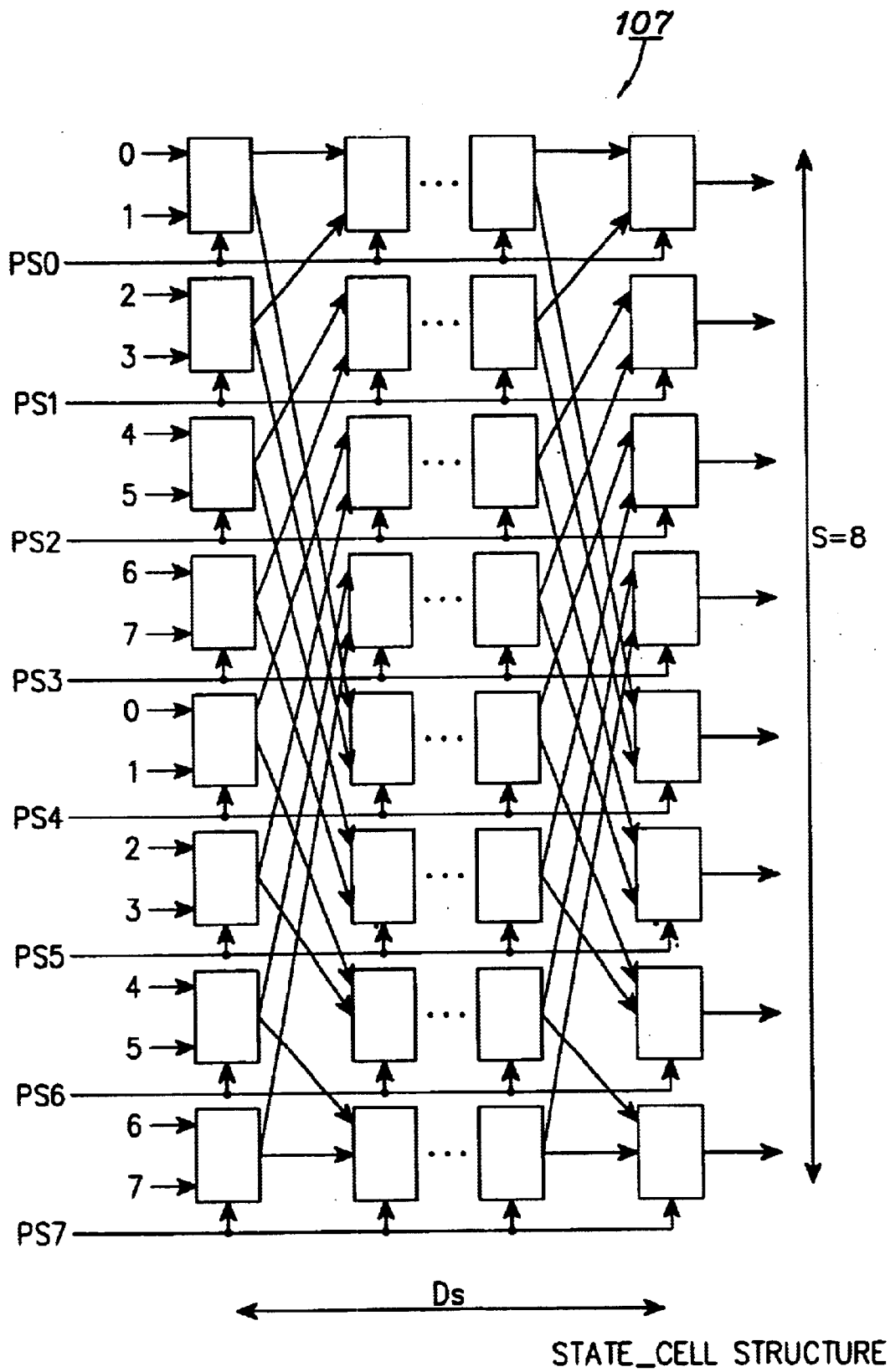
FIG. 10A illustrates the structure of an ML state searcher shown in FIG. 2.

FIG. 10A is a block diagram of the ML state searcher 107 according to the embodiment of the present invention. The configuration and operation of the ML state searcher based on the register exchange scheme is disclosed in Korea Application No. 1998-62713, it can be a reference of this invention. The ML state searcher 107 includes a plurality of cells in an array of rows and columns and a plurality of path selection lines. Each selection line is connected to a corresponding row cell, for receiving the path selection bit. The plurality of cells in the array are connected such that each cell receives two state values from previous cell according to the trellis predetermined by a encoder's generation polynomial except for the first column of cells. Cells in the first column receive two input values, upper input value and lower input value, as shown in FIG. 10a. A cell in each column stores one of the two input state values based on the received corresponding path selection bit and feeds the stored state value to two cells in corresponding rows in the next column at the next time instant according to the state relationship of the trellis. By sequential performing of the above procedure for a predetermined time, the state values in a particular column cells converge to the same value at a certain time point. The converged value is an ML state value. At the end column of the ML searcher 107 output the converged value as ML state. The ML searcher 107 takes Ds clock time (for example, 4*k, where k=number of encoder memory +1) for search the ML state.

For example, with eight states, the ML state searcher 107 receives 0 and 1 at the cell in the first row and the first column, 2 and 3 at the cell in the second row and the first column, 4 and 5 at the cell in the third row and the first column, and 6 and 7 at the cell in the fourth row and the first column. The inputs of the cells at the fifth to eighth rows and the first column are the same as first to fourth row and the first column. Each cell in the first column selects one of the state values based on a path selection bit received according to a clock signal from a corresponding selection line and feeds the selected state value to cells in the next column according to the state relationship of the trellis. Iterative performing of the procedure for a predetermined time (Ds), the state values of the last column cells output the same converged value, one of the state values 0 to 7. For example, if a converged value is 5, the cells in the last column have the same state value, 5. Here, 5 is determined as an ML state value. The ML state searcher 107 has a time delay Ds to receive initial state values in the first column, converge them to one state value, and output the converged value from the rightmost column.

Figure 10B:
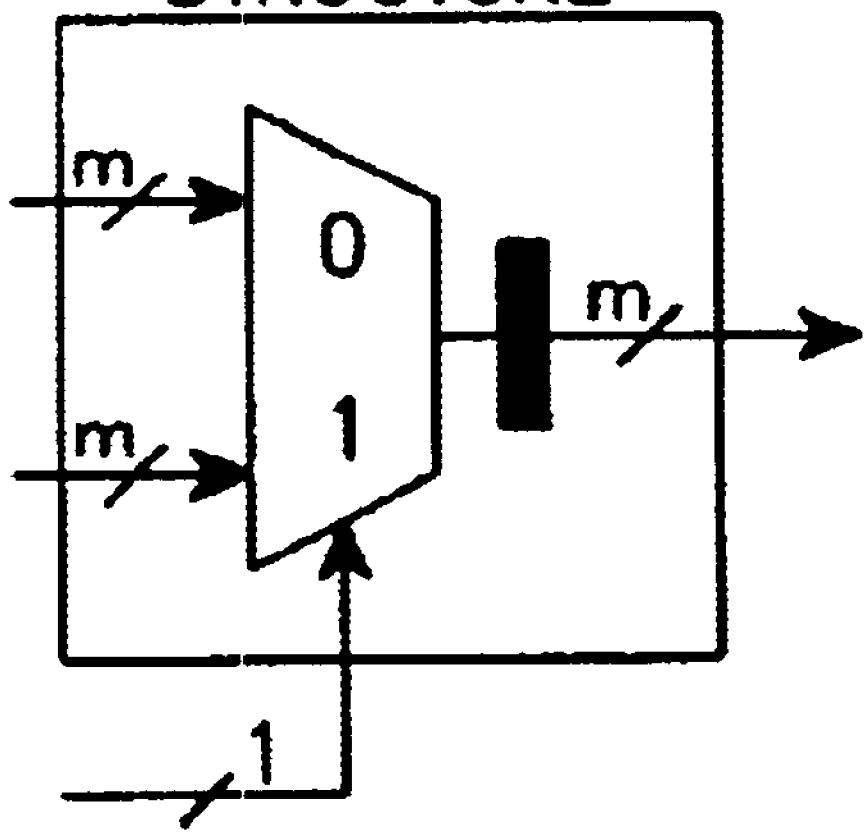
FIG. 10B illustrates the structure of a memory cell shown in FIG. 10A.

FIG. 10B illustrates the structure of a cell in the ML state searcher 107. The cell has a selector and a register memory. The selector has two input ports for receiving state values from previous cells or initial inputs and one select port for receiving a path selection bit. That is, the cell selects one of the two input state values based on the path selection bit and stores the selected state value in the register memory. The memory outputs the state value by an input clock.

Figure 12A:
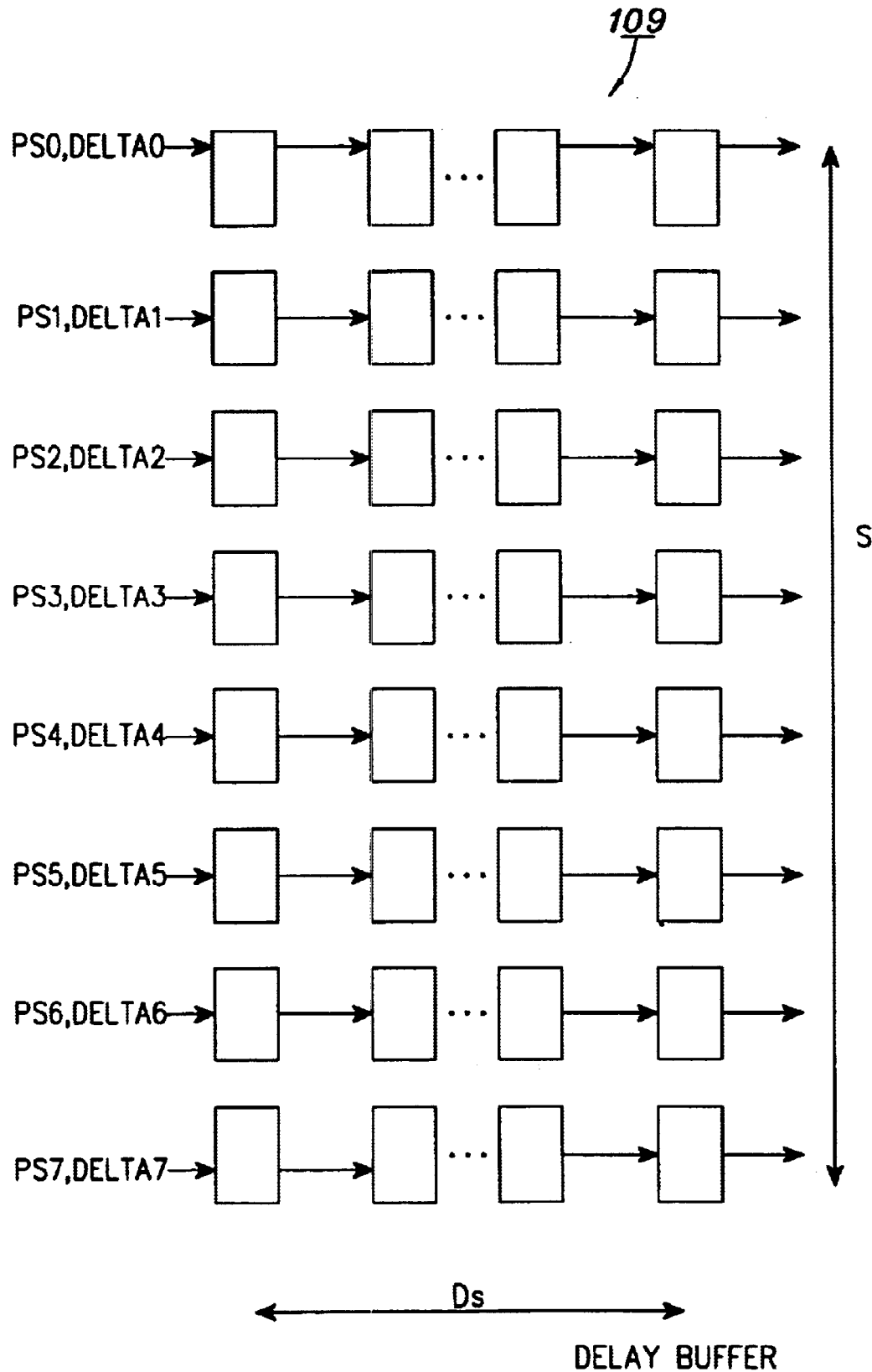
FIG. 12A illustrates the structure of a delay shown in FIG. 2.
Figure 12B:
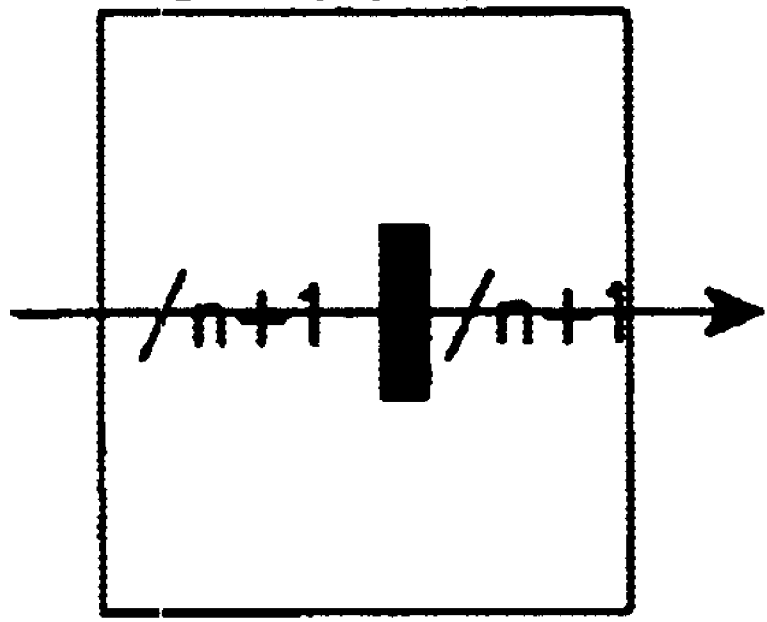
FIG. 12B illustrates the structure of a memory cell shown in FIG. 12A.

Referring back to FIG. 2, a delay 109 receives the n-bits LLRs, path 1-bit selection bit and a n−1 bits reliability information δ for each state from the ACS 103 and delays the inputs by the delay involved in the ML state searcher 107, Ds. FIG. 12A illustrates the structure of the delay 109 having memory cells which form eight rows, the same number of states. The delay 109 delays the received LLR with time delay Ds for outputting the received LLR. FIG. 12B illustrates the structure of a component memory cell acting as a buffer. The memory cells receive LLR and store for a predetermined time delay and output the LLR to the next memory cell by a clock signal. An LLR updater 111 receives Ds-delayed LLRs from the delay 109, compares the LLRs with the previous LLRs, and updates LLRs if they are less than their previous LLRs.

Figure 11A:
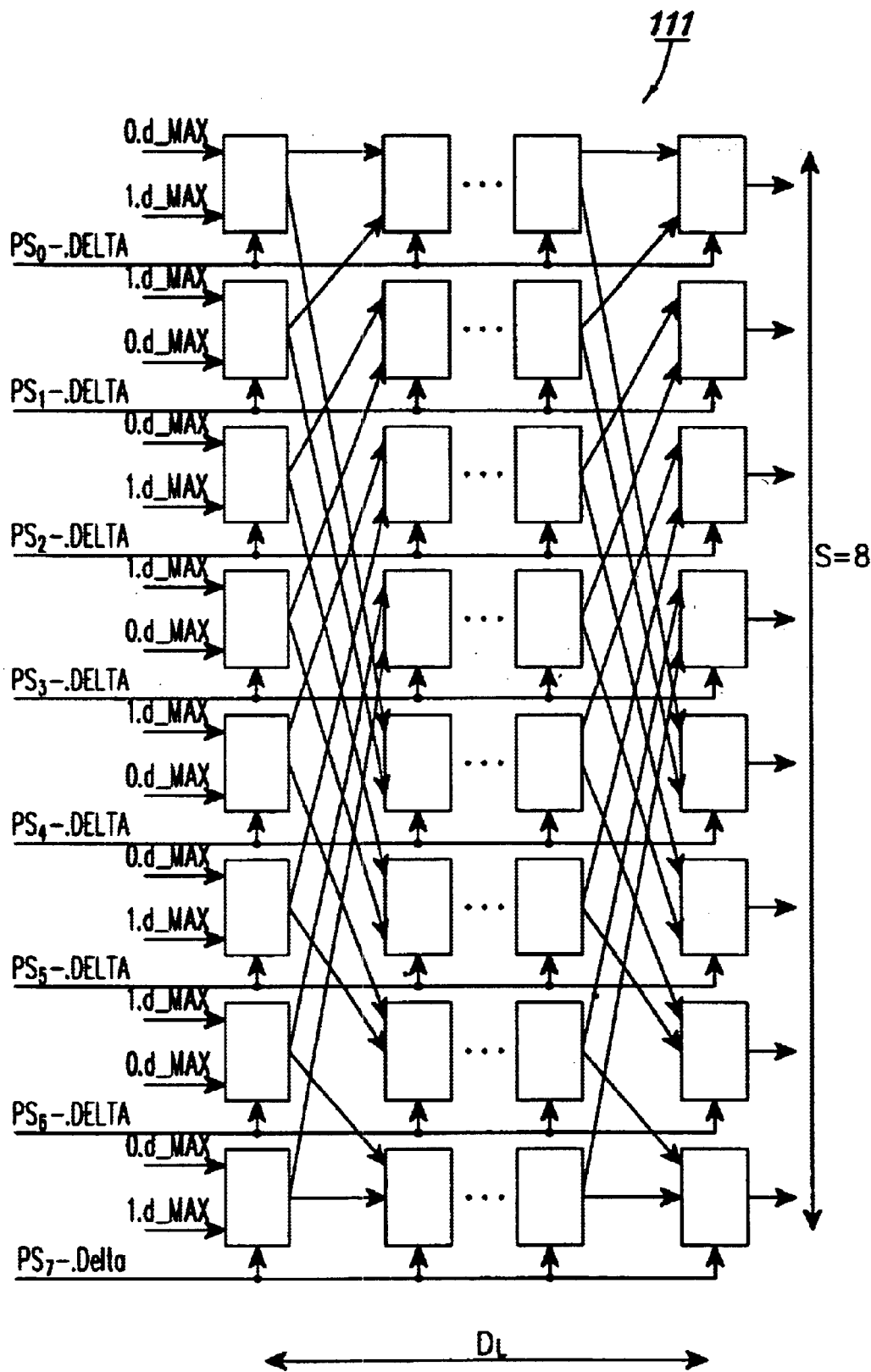
FIG. 11A illustrates an LLR updater shown in FIG. 2.

FIG. 11A illustrates the structure of the LLR updater 111 having processing elements (PEs), which form predetermined columns and rows being the same number of states, and having plurality of initial input values, 0.d_max or 1.d_max. The d_max is determined by a maximum quantization level(for example 127, 7 bit). Therefore, the initial input values are expressed by 8 bit, which the MSB is 0 or 1 and the other bits are all 1). The LLR updater 111 takes $D_L$ clock period(for example, 16*k, where k=number of encoder memory (3)+1=4). Referring to FIG. 11A, the LLR updater 111, being a modification of RESOVA cells, has PEs in an array with rows and columns and a plurality of selection lines. The selection lines receive path selection bits and δ and are connected in parallel to PEs in corresponding rows. The LLR updater 111 updates not a one-bit hard decision value but an (n)-bit soft value, LLR. Therefore, an inner data communication line within the LLR updater 111 is (n) bits. Here, n-1 bits represent δ and the other one bit represents a path selection bit. Also, each PE includes logic for updating the previous LLR. The LLR updater 111 receives Ds (or Ds-1) clock delayed LLR values from the delay 109 upon generation of every clock signal from the clock generator 118. These LLRs have already been computed through the ACS operation for the eight states before Ds or (Ds-1) clock elapsed. Each PE has two input ports except for the selection line. Each PE in the first column receives information bit 0 through upper (or lower) input port and information bit 1 through the other lower (or upper) input port as shown in FIG. 11a. Each of PEs in the other columns is connected to two PEs in the previous column according to the trellis structure, for receiving the values of the previous PEs.

Figure 11B:
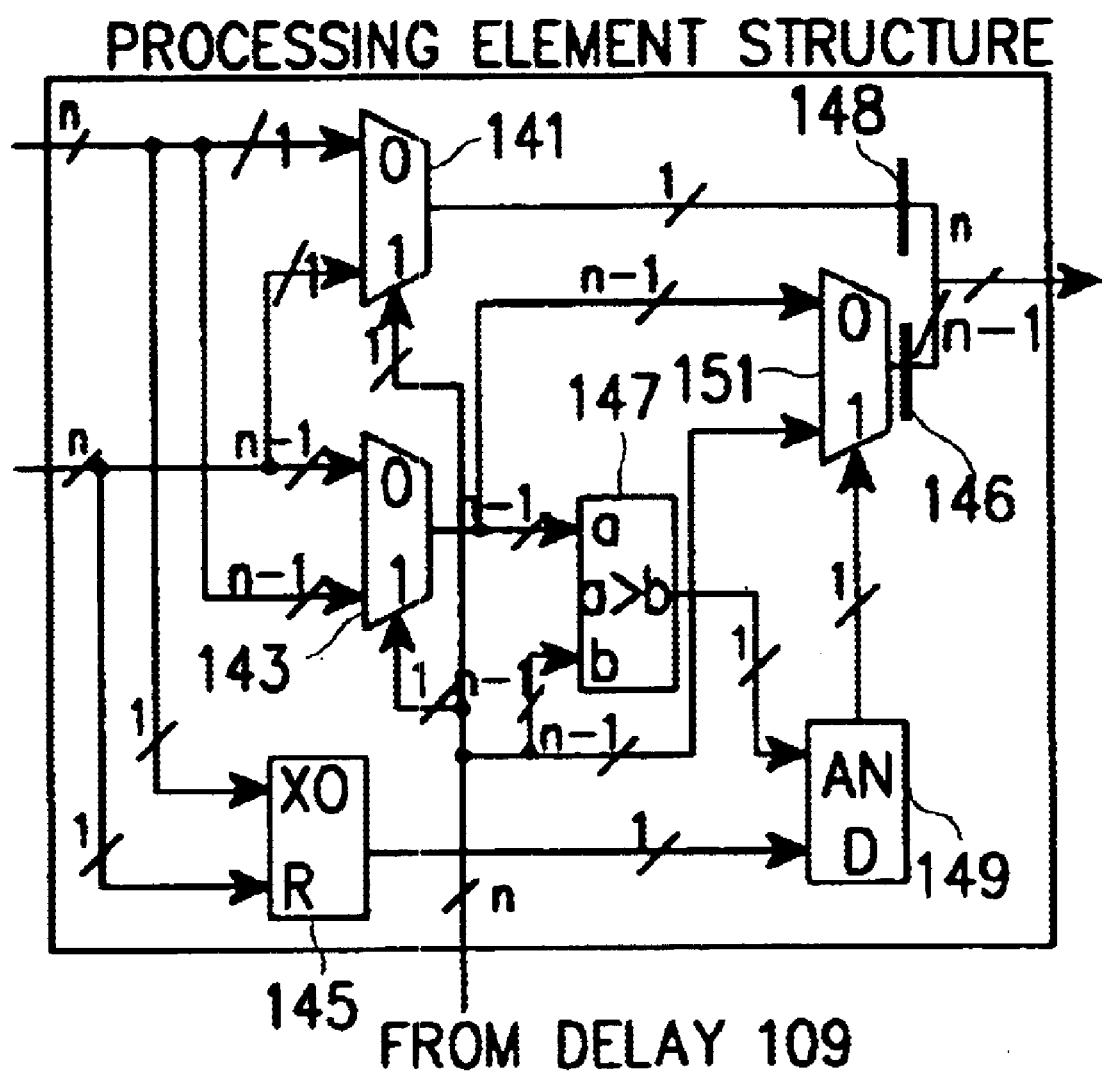
FIG. 11B illustrates the structure of a processing element (PE) shown in FIG. 11A.

The configuration and operation of the PE will be described in detail referring to FIG. 11B. It is first to be noted that an LLR is defined as an n-1 bits δ and a one-bit path selector. Referring to FIG. 11B, one PE receives two (n)-bit LLRs through upper input port and lower input port from the previous PEs. The exception is that each PE in the first column receives (n) the initial input value. A first multiplexer 141 receives two path selection bits (first and second selection bit, respectively) of the two LLRs from PEs in the previous column connected to the PE according to the trellis and selects one of the path selection bits based on a path selection bit (referred to as a third path selection bit) received from the corresponding select line. A second multiplexer 143 receives two n-1-bits δ values of the two LLRs through its two input ports and selects one of the δ values based on the third path selection bit. A comparator 147 compares the n-1 bist δ values received from the second multiplexer 143 with a δ value of an LLR currently received through the corresponding selection line. Let the δ value received from the second multiplexer 143 be "a" and the δ value currently received at the PE through the selection line be "b". If a is greater than b, the comparator 147 outputs a high signal 1 (or low signal) and if b is greater than a, it outputs a low signal 0 (or high signal). An XOR gate 145 performs exclusive oring the two path selection bits received from the previous PEs. The outputs of the comparator 147 and the XOR gate 145 each are one bit. An AND gate 149 performs AND-gating the outputs of the adder 145 and the comparator 147. A third multiplexer 151 receives the n-1 bits δ value from the second multiplexer 143 and the n-1 bits δ value from the selection line and selects one of the δ values based on the output of the AND gate 149 as a select signal. The memory 146 and 148 store output of the first multiplexer 141 and third multiplexer 151 respectively. The path selection bit output from the memory 148 and the δ value output from the memory 146 form an updated (n)-bit LLR.

Referring back to FIG. 2, a LLR selector 113 receives eight updated LLRs from the LLR updater 111 and selects one of the LLRs based on the ML state value received from the ML state searcher 107. For example, the LLR selector 113 receives converged value 5 from the state searcher 107, outputs the 5th updated LLR. An output buffer 115 buffers sequentially LLRs selected by the selector 113.

In the present invention, two sliding windows are used to efficiently use a memory and reduce decoding time delay. One of them is an ML state search window Ds operated by the ML state searcher 107 to search for an ML state value and the other is an LLR update window $D_L$ operated by the LLR updater 111 to output an optimum LLR. The ML state search window searches for the ML state value after a time delay, approximately Ds and the LLR update window selects an updated LLR corresponding to the ML state value among a plurality of updated LLRs and outputs the selected LLR after a time delay, approximately $DS+D_L$.

Figure 3:
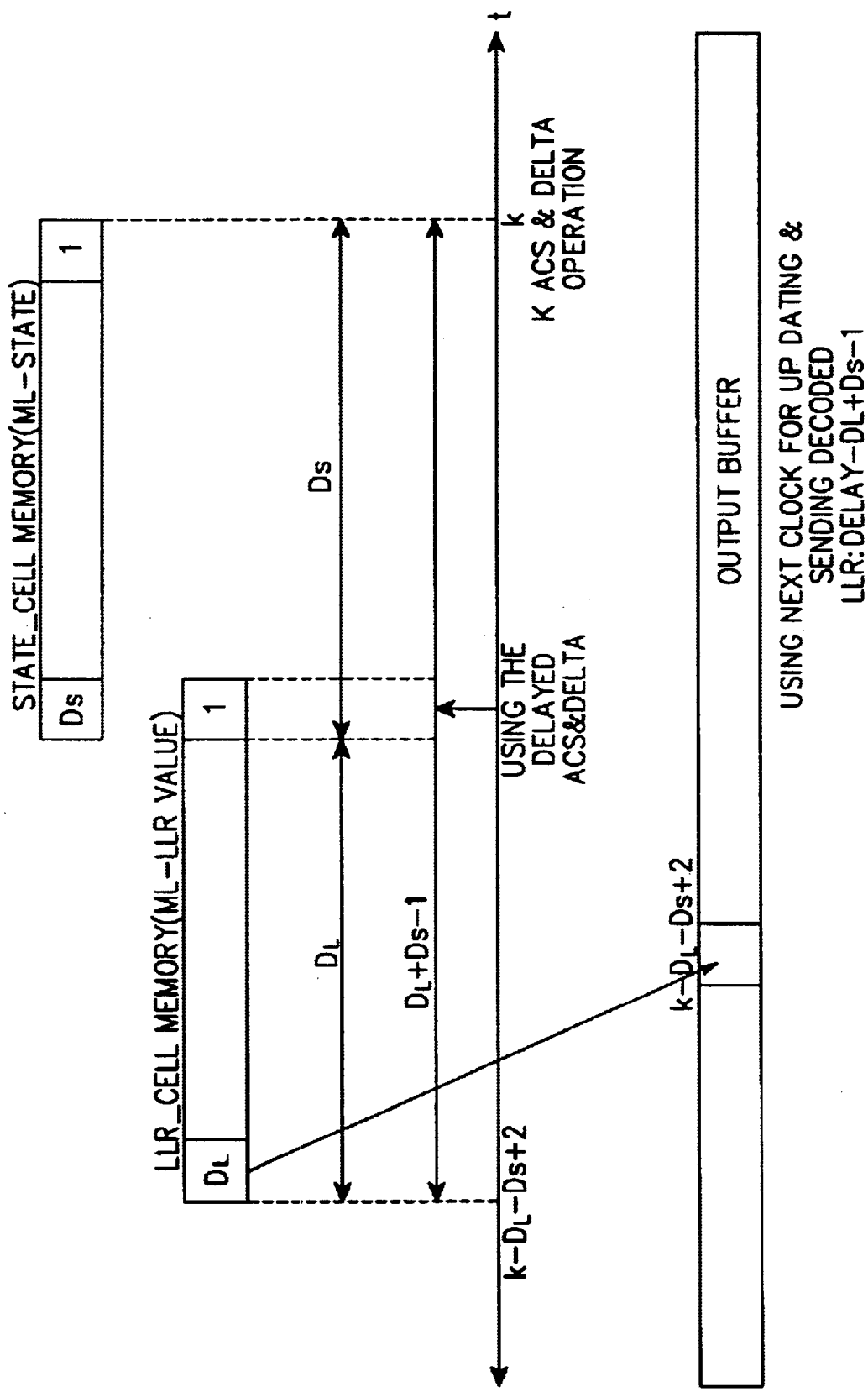
FIG. 3 illustrates a method of synchronizing an LLR cell to a state cell in the RESOVA decoder shown in FIG. 2.
Figure 4:
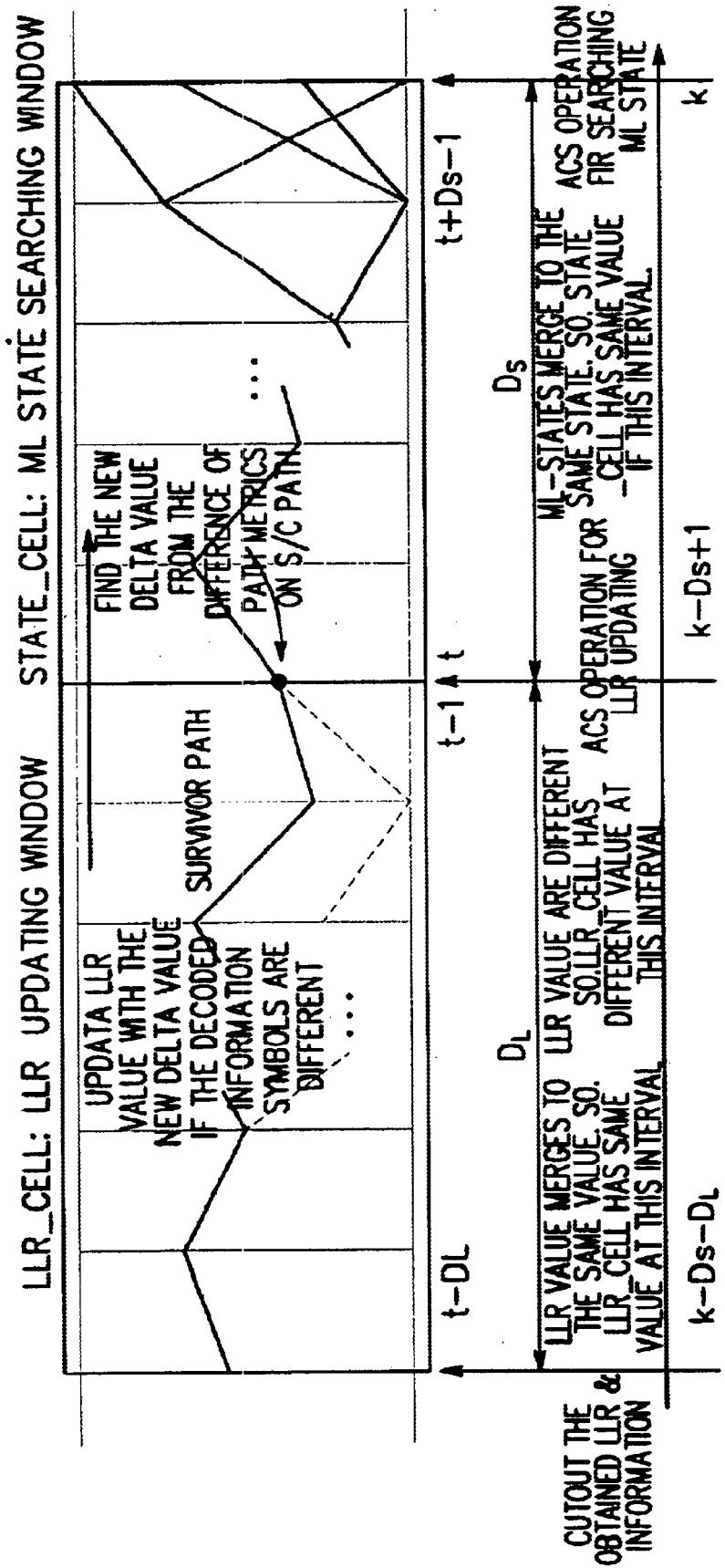
FIG. 4 is a trellis diagram illustrating a decoding process at a state cell window and at an LLR cell window in the RESOVA decoder shown in FIG. 2.
Figure 5:
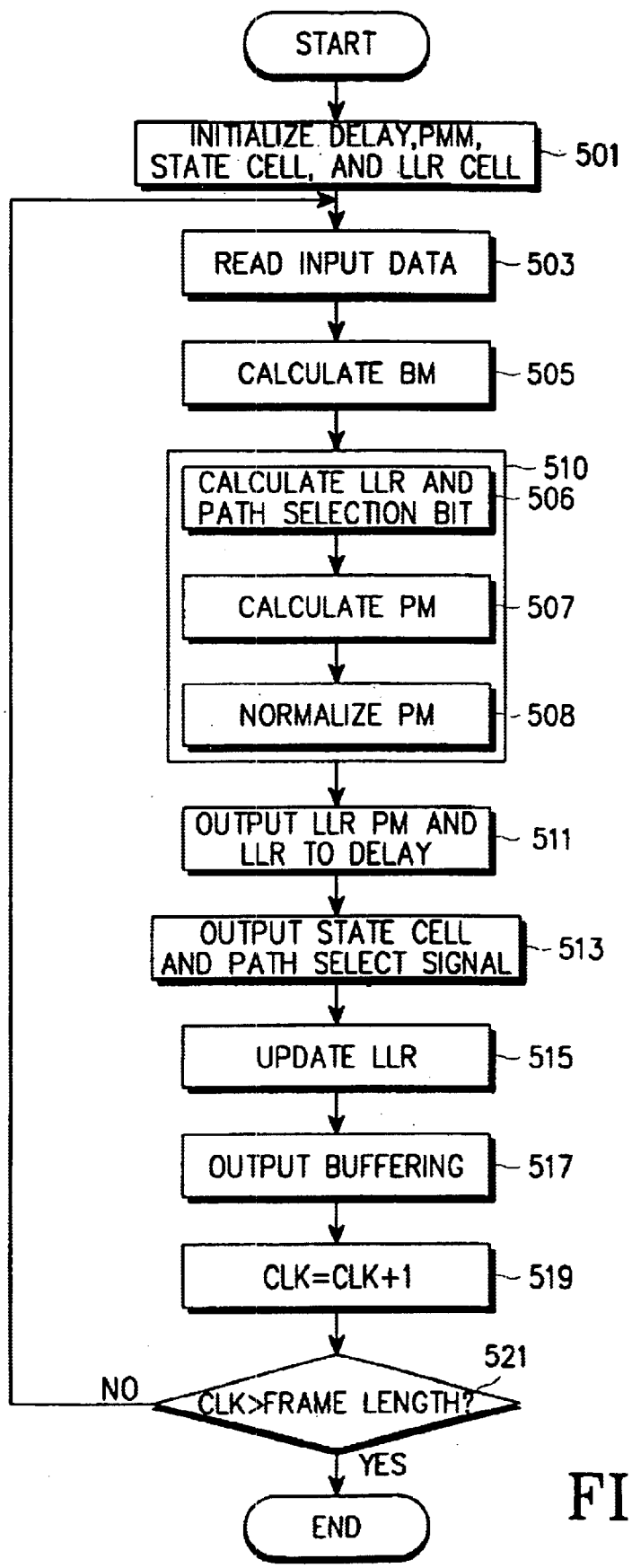
FIG. 5 is a flowchart illustrating the whole operation of the RESOVA decoder shown in FIG. 2.

FIG. 3 illustrates the operation relationship between the ML state search window and the LLR update window in time, and FIG. 4 illustrates time points when an ML state value and an LLR value are output in the operations of the ML state search window and the LLR update window. Let the ACS operation occur at time K. Then, the ML state value is output after a (K-Ds+1) time delay, as shown in FIG. 3. An optimum LLR is selected at the time point when the ML state value is output and updated and output after a time delay of $(D_L+1)$ from time (K-Ds+1). Since the updated LLR is output after a time delay $(D_L+Ds-2)$ from time K, a final LLR is output after a time delay $(K-D_L-Ds+2)$ from time K. FIG. 5 is a flowchart illustrating the operation of the RESOVA decoder according to the present invention. Referring to FIG. 5, in the absence of a clock signal from the system, the delay 109, the PMM 105, the ML state searcher 107, and the LLR updater 111 initialize their cells or PEs by resetting them in step 501. Upon receipt of the clock signal, the BMC 101 receives input data from an input buffer (not shown) in step 503. In step 505, the BMC 101 calculates BMs for the paths between the states at the previous time instant and the states at the current time instant using the input data and codewords that the decoder knows and feeds the BMs to the ACS 103. The ACS 103 obtains the up (upper input port) and down (lower input port) PMs associated with each state from the BMs and calculates reliability information by Eq. (9) and LLRs in step 510.

Figure 1:
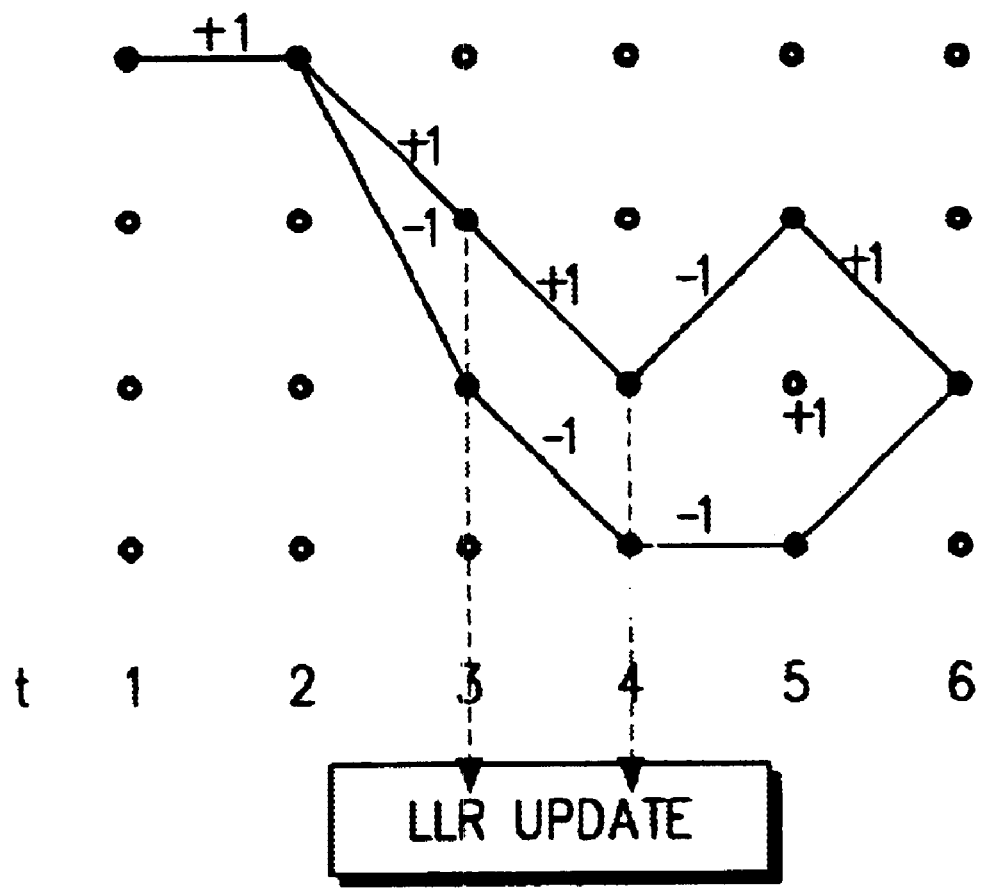
FIG. 1 is a trellis diagram to be referred to for describing an LLR update method that is applied to the present invention.

To describe step 510 more specifically, the ACS 103 calculates LLRs and path selection bits in step 506, calculates PMs using the BMs in step 507, normalizes the PMs in step 508. The PM normalization is the process of subtracting a predetermined value from a PM if the PM is greater than a predetermined value to prevent overflow of PM values. For details, see Korea Application No. 1998-062724. The ACS 103 feeds the LLRs to the delay 109 in step 511 and the path selection bits to the ML state searcher 107 in step 513. The path selection bits are information estimated by hard decision for the respective states. The delay 109 delays the LLRs by Ds (Delay for search ML state) and feeds the delayed LLRs to the LLR updater 111 and the ML state searcher 107 searches for an ML state value based on the path selection bits. In step 515, the LLR updater 111 receives the delayed LLRs and updates LLRs as similar method shown in the trellis of FIG. 1. The LLR selector 113 receives the updated LLRs, selects one of the LLRs based on the ML state value received from the ML state searcher 107, and buffers the selected LLR in the output buffer 115 in step 517.

The controller 117 increases the number of CLK by 1 in step 519 and determines whether the CLK is greater than frame length in step 521. If the CLK is greater than the frame length, the controller 117 ends the decoding operation and if it is less than the frame length, the controller 117 iteratively perform steps 503 through 519.

In the above embodiment of the present invention, when the ML state search window reaches a frame boundary, a frame-based operation is over by zero-termination. In this case, only an ML state at the output side of the ML state search window is output, not the other ML states within the ML state search window.

Therefore, a RESOVA decoder according to another embodiment of the present invention is so configured that all ML states within the ML state search window can be output.

Figure 13:
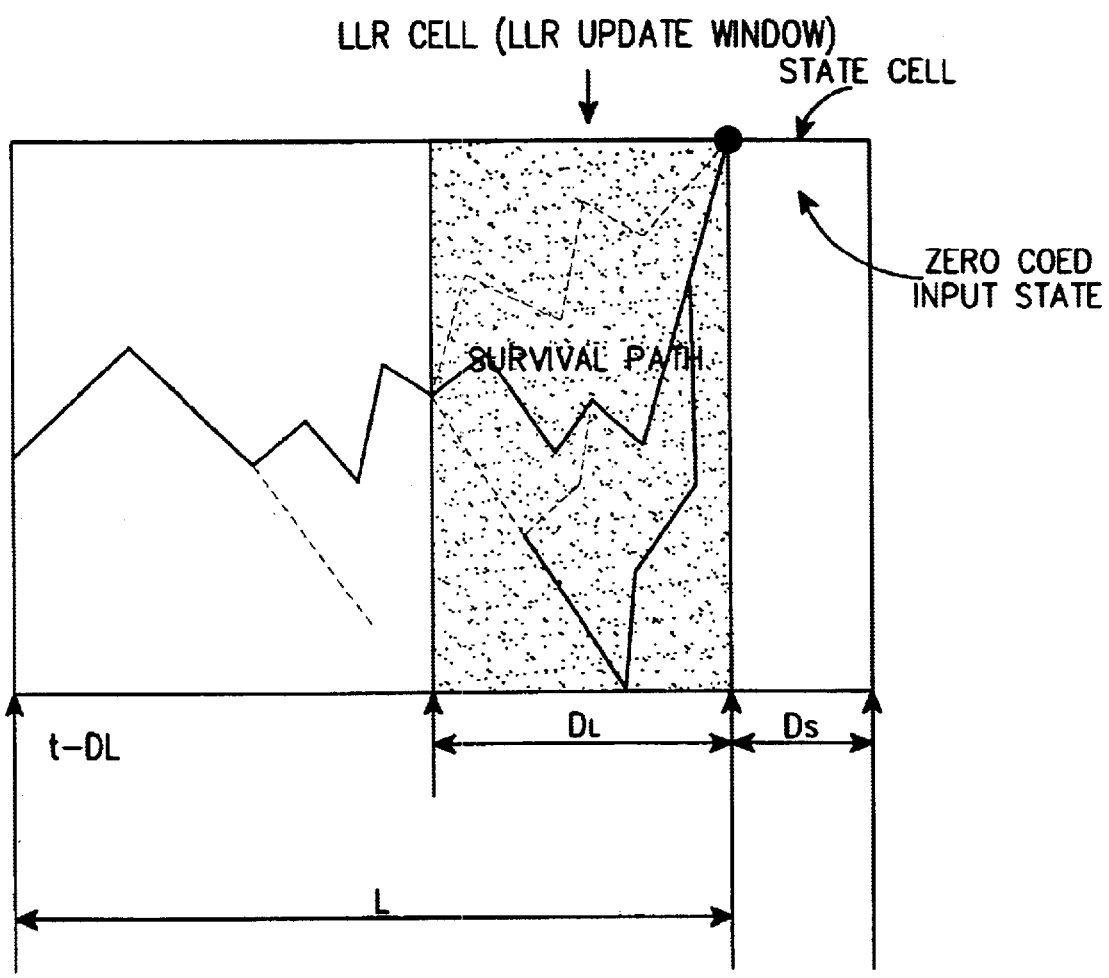
FIG. 13 is a trellis diagram illustrating a decoding process at an ML state search window and an LLR update window in the case where virtual symbols are received in a RESOVA decoder according to another embodiment of the present invention.
Figure 14:
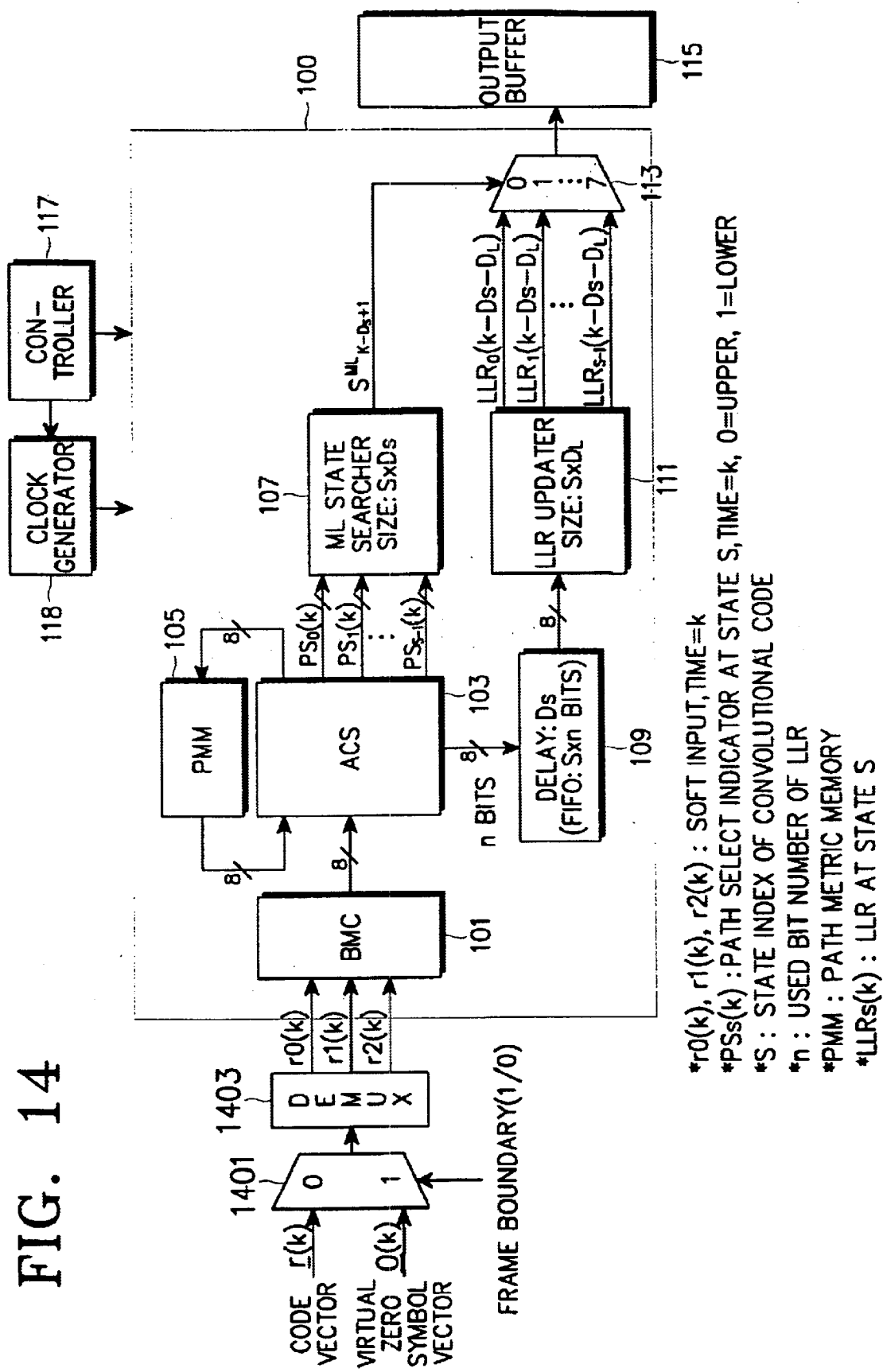
FIG. 14 is a block diagram of the RESOVA decoder with input of virtual code symbols according to the second embodiment of the present invention.

FIG. 13 illustrates decoding in the ML state search window and the LLR update window in the RESOVA decoder with virtual symbol inputs and FIG. 14 is a block diagram of the RESOVA decoder for decoding in the case of virtual code inputs according to the second embodiment of the present invention.

Referring to FIG. 13, when the ML state search window reaches a frame boundary, virtual zero symbols are inserted for the time period Ds starting from the time instant following the time instant when the ML state search window reaches the frame boundary. Thus, the output side of the ML state search window and the LLR update window reach the frame boundary.

The operation of FIG. 13 is implemented in the RESOVA decoder shown in FIG. 14 and the same components as shown in FIG. 2 will not be described.

In FIG. 14, the controller 117 detects a frame boundary and outputs a frame boundary signal indicating whether the frame boundary is reached or not. A selector 1401 receives an input code symbol and a virtual zero symbol and selects one of them based on the frame boundary signal received from the controller 117. Specifically, the selector 1401 selects the input code symbol at a location other than the frame boundary and the virtual zero symbol at the frame boundary for Ds clock time. A demultiplexer (DEMUX) 1403 demultiplexes a sequence of symbols received from the selector 1401 to r0, r1, and r2 and feeds them to the BMC 100 for the frame boundary. Virtual zero symbols are provided to the decoder 100 for the time period Ds to make the output side of the ML state search window reach up to the frame boundary after the frame boundary.

With the use of the ML state search window and the LLR update window based on the RESOVA, the RESOVA decoder according to the present invention reduces decoding delay by searching for an ML state without time delay as compared to a TBSOVA and decreases memory size by obviating the need for a memory in searching for the ML state. Moreover, an ML state search operation is further performed by the size of the ML state search window at a frame boundary, without zero termination at the frame boundary. Therefore, more accurate decoding can be achieved.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A decoder comprising:
   a branch metric calculating circuit (BMC) for calculating $2^k$ branch metrics (BMs) upon response to k input values at a time, where k is the same number of a encoder memory;
   an add-compare-select circuit (ACS) for receiving the BMs and previous path metrics (PMs) and generating $2^k$ LLRs (Log Likelihood Ratio), each LLR including corresponding path selection bit and reliability information;
   a maximum likelihood (ML) state searcher for sequentially receiving series of path selection bits from the ACS, searching a ML state according to the path selection bits with a predetermined initial values for Ds clock period, and outputting one of the initial value as the ML state;
   a delay for receiving the LLRs from the ACS at a clock period, delaying the LLRs for the Ds clock period;
   a LLR updater for receiving the LLRs from the delay period and updating the LLRs by using sequentially being received corresponding path selection bits and reliability information for $D_L$ clock period; and
   a selector for selecting one of the updated LLR values according to the ML state value.

2. The decoder of claim 1, wherein a current path metric is obtained by adding the branch metric and the previous path metric.

3. The decoder of claim 1, wherein the ACS comprises:
   a first adder for receiving a first BM and a first PM according to a trellis, which is determined by a encoder generation polynomial, adding the received first BM and PM, and outputting the first added value;
   a second adder for receiving a second BM and a second PM according to the trellis, adding the received second BM and PM, and outputting the second added value;
   a comparator for receiving the the first and second added values, comparing the received values, and generating the path selection bit based on the comparison;
   a reliability information calculator for receiving the first and second added values and the path selection bit and calculating the reliability information; and
   a selector for receiving the first and second added values and the path selection bit and selecting one of the added values as a next path metric (NPM).

4. The decoder of claim 3, wherein the reliability information (δ) is obtained by based on subtracting the first added value from the second added value.

5. The decoder of claim 4, wherein the reliability information (δ) is calculated by $$\delta = \alpha^* |PM_U - PM_L|$$

wherein α is a constant; $PM_U$ is an upper PM value, and $PM_L$ is a lower PM value.

6. The decoder of claim 5, wherein $PM_U$ is the first added value and $PM_L$ is second added value.

7. A decoding method at a receiver in a mobile communication system, comprising the steps of:
   calculating a plurality of BMs by binary computation a plurality of input symbols with all possible codewords;
   generating next PMs, reliability information, and a path selection bit at a time instant K by performing an add-compare-select operation on the BMs and previous PMs;
   outputting an ML state after a time period Ds from the time instant K based on a path selection bits, which is generated by the add-compare-select operation for the Ds period;
   delaying a LLRs, each LLR including reliability information and a corresponding path selection bit by the time Ds from the time instant K;
   updating Ds-delayed LLRsusing plurality of reliability information and path selection bits for $D_L$ period; and
   selecting an updated LLR value based on the ML state among the updated LLRs.

8. The decoding method of claim 7, wherein the generating step comprises the steps of:
- calculating current PM by adding a previous PM and a BM received according to a trellis which is determined by encoder generation polynomial;
- generating the path selection bit using the PMs;
- calculating the reliability information using the PMs; and
- generating LLR values by adding the path selectors to the reliability information.

9. A decoding method at a receiver in a mobile communication system, comprising the steps of:
- calculating a plurality of BMs by using a plurality of input symbols with all possible codewords;
- generating next PMs, LLRs, each LLR including reliability information and a path selection bit at a time instant K by performing an add-compare-select operation on the BMs and previous PMs;
- receiving Ds number of path selection bits for a time period Ds from the time instant K and outputting an ML state value for the time instant Ds; and
- updating the LLRs using plurality of reliability information and path selection bits, which is generated for a time instant $D_L$; and
- outputting an updated LLR selected based on the ML state value.

10. A turbo code decoder comprising:
- a BMC for calculating BMs by using a plurality of input symbols with all possible codewords;
- an ACS for receiving the BMs and previous PMs, which is generated at just previous ACS operation, and generating a plurality of path selection bits and plurality of reliability information at a first time instant;
- an ML state searcher for searching an ML state value representing an ML path using series of path selection bits, which is received from the ACS for a first time period;
- a LLR updater for updating a reliability information by using a series of path selection bits and plurality of reliability information for a second time period; and
- selector for selecting an updated reliability value by using the ML state value.

11. A turbo code decoding method comprising the steps of:
- calculating BMs by using a plurality of input symbols with all possible codewords;
- receiving the BMs and previous PMs, which is generated at just previous ACS operation;
- generating plurality of path selection bits and plurality of reliability information at a first time instant;
- searching an ML state value representing an ML path using series of path selection bits for a first time period;
- updating the reliability information by using a series of path selection bits and plurality of reliability information for a second time period; and
- selector for selecting an updated reliability value by using the ML state value.

* * * * *